(12) United States Patent
Can

(10) Patent No.: US 7,528,634 B2
(45) Date of Patent: May 5, 2009

(54) HIGH VOLTAGE COMPARATOR USING SLIDING INPUT LOW VOLTAGE DEVICES

(75) Inventor: Sumer Can, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 279 days.

(21) Appl. No.: 11/427,033

(22) Filed: Jun. 28, 2006

(65) Prior Publication Data

US 2008/0001636 A1    Jan. 3, 2008

(51) Int. Cl.
H03F 3/45 (2006.01)
(52) U.S. Cl. .......................... 327/66; 327/62; 327/563; 330/252
(58) Field of Classification Search .................. None
See application file for complete search history.

(56) References Cited

U.S. PATENT DOCUMENTS 6,657,495 B2 * 12/2003 Ivanov et al. ............... 330/255
6,965,266 B1 * 11/2005 Can ........................... 330/252
7,064,609 B1 * 6/2006 Beck et al. .................. 330/253
2007/0279125 A1 * 12/2007 Tripathi et al. .............. 327/563

* cited by examiner

Primary Examiner—Donovan Lincoln
Assistant Examiner—Terry L Englund
(74) Attorney, Agent, or Firm—Fogg & Powers LLC

(57) ABSTRACT

A voltage comparator contains low voltage devices (e.g., bipolar or MOS transistors) and high voltage devices (e.g., DMOS transistors). The low voltage devices, which cannot sustain a voltage greater than a relatively small range of variation that is substantially less than the range of potential variation of the input voltage, are connected in a differential amplifier configuration to perform precision differential measurements on the input voltage. The high voltage devices are interconnected with the low voltage devices in a manner that enables operating levels of the low voltage devices to move up/down, or 'slide', with variations in the input voltage, so that the low voltage devices are effectively immune to high levels of the input voltage.

18 Claims, 4 Drawing Sheets

HIGH VOLTAGE COMPARATOR USING SLIDING INPUT LOW VOLTAGE DEVICES

FIELD OF THE INVENTION

The present invention relates in general to DC power supply systems and subsystems thereof, and is particularly directed to a new and improved voltage comparator circuit architecture, such as may be employed as an over-current detection comparator for a pulse width modulation (PWM) controller of a DC-DC converter, which employs low voltage devices for performing precision differential measurements on input voltages whose magnitudes may be considerably larger than voltages that can be sustained by such low voltage devices. The low voltage devices are connected with high voltage devices so as to provide high input protective buffering for the low voltage devices, and enable the operating levels of the low voltage devices to move up and down or 'slide' with variations in the magnitude of the input voltage being monitored.

BACKGROUND OF THE INVENTION

DC-DC converters are commonly used to supply DC power to a variety of electronic systems and devices, such as, but not limited to, relatively low voltage circuits, such as personal computers and portable digital assistants, as well as high voltage integrated circuits (e.g., automotive electronic subsystems) and the like, and are available in a variety of configurations for deriving a desired DC output voltage from a given source of DC input voltage. As a non-limiting example, the DC-DC converter may be configured as a buck mode architecture, including one or more power switches, current flow paths through which are coupled between a DC input voltage terminal and a reference voltage terminal (e.g., ground), and the common or phase node between which is connected through an output inductor to an output voltage node, to which a storage capacitor and the powered load/device are connected. By controllably switching the power switches on and off, the upstream end of the output inductor is alternately connected between the DC input voltage and the reference voltage. This produces an alternately ramped-up and ramped-down output current through the inductor to the output node, so as to deliver a prescribed DC output voltage to the load.

A voltage mode DC-DC converter, which is typically used in applications where the load current demand is relatively large, includes a voltage control loop having an error amplifier, the output of which is used to control a PWM comparator, which generates a PWM voltage waveform. This PWM voltage waveform is applied to driver circuitry, which controls the turn on/off times of the power switches, in accordance with transitions in respective PWM voltage waveforms with which it drives the power switches. To meet the demand for substantial load current, the PWM waveforms that control the on/off switching of the power switches are typically mutually complementary, so that a conductive path from one or the other of the input voltage source and ground will be continuously provided through one or the other power switch to the output inductor. This mode of operation is customarily referred to as continuous conduction mode (CCM).

To regulate the DC output voltage, a voltage representative thereof is fed back to the error amplifier and compared with a DC reference voltage to produce an error voltage. This error voltage is amplified and filtered to produce an input signal to a PWM comparator, and is compared thereby with a sawtooth voltage waveform, to produce the PWM waveform, the pulse width of which is defined in accordance with the crossings of the error voltage threshold by the sawtooth voltage waveform.

One of the main issues faced by the PWM controller is the need to provide over-current protection; for this purpose, the PWM controller employs an over-current detection comparator. For low voltage applications (e.g., on the order of one to only several volts), such as in personal computers and hand-held devices, this comparator has been customarily implemented using low voltage components, such as bipolar or metal-oxide-semiconductor (MOS) transistors, whose manufacturing tolerances can be readily replicated, and thereby ensure the production of well matched and parameter-predictable devices that will enable the comparator circuitry to accurately sense variations in its monitored inputs.

However, such low voltage device-based architectures cannot be used in relatively high voltage applications (e.g., those employing voltages on the order of three to twenty-eight volts or greater), since such relatively large voltages would damage or destroy the low voltage devices. Although high voltage devices, such as double diffused MOS (DMOS) transistors, are able to handle these increased voltage levels, that are not suitable for implementing precision or high electrical sensitivity input stages that are required for amplifiers and comparators, such as those employed in an over-current detection comparator. Their use is presently limited to a relatively small number of circuit functions, such as switches, cascade devices, high voltage application devices, and DC-biasing devices. Consequently, there is a need for a comparator that is able to handle high input voltages, while being able to monitor relatively small variations in such voltages with the sensitivity and precision that is currently available only in low voltage implementations.

SUMMARY OF THE INVENTION

In accordance with the present invention, this objective is successfully achieved by a new and improved high voltage comparator architecture, that contains both low voltage, relatively precision electrical measurement, devices (e.g., low voltage bipolar or MOS transistors) and high voltage devices (e.g., DMOS transistors). The low voltage devices cannot sustain a voltage thereacross that is greater than a relatively small range of variation (e.g., on the order of one to only a few volts). This relatively small range of variation is substantially less than the range of potential variation of the input voltage. Being relatively high electrical sensitivity components, the low voltage devices are used to perform very accurate differential voltage measurement on the input voltage.

The high voltage devices, on the other hand, can sustain relatively high voltages, so that they can accommodate a relatively wide range of potential variation of the input voltage. These devices are used to provide high input protective buffering for the low voltage devices, and are connected in a circuit configuration with the low voltage devices that causes operating levels of the low voltage devices to move up and down or 'slide' with a variation in the input voltage, and thereby prevents application of a voltage thereacross greater than the relatively small range of variation that can be sustained by the low voltage devices.

To this end, the high voltage comparator of the invention contains an upper voltage level-processing, comparator input stage and a lower voltage level-processing, comparator input stage having inputs thereof connected in parallel to differentially monitor an input voltage. The upper comparator input stage is used to monitor variations in an input voltage whose amplitude is relatively close to, or in the neighborhood of, the relatively large magnitude supply voltage of the upper power supply rail (e.g., three to twenty-eight volts), while the lower comparator input stage is used to monitor variations in an input voltage whose amplitude is relatively close to, or in the neighborhood of, the relatively low magnitude supply voltage of the lower power supply rail (e.g., ground). Each of the comparator input stages has the same circuit architecture, except that they are configured of complementary polarity components, referenced to complementary voltage supply rails. Current outputs of the two comparator input stages are then mirrored and combined in a cascaded transconductance amplifier output stage, to produce an amplified output current in accordance with the difference in the differentially monitored voltage inputs.

The basic architecture of a respective comparator input stage is that of a folded-cascade differential amplifier circuit formed of well matched, low voltage devices, such as, but not limited to, bipolar transistors or MOS transistors, for performing precision differential voltage measurements, and an associated set of high voltage devices, that provide protective buffering between the high input voltages and the low voltage devices. For the non-limiting case of a bipolar device implementation, the folded-cascade differential amplifier circuit includes low voltage bipolar transistors connected in differential amplifier configuration.

These and other low voltage and high voltage devices of the circuit are coupled to receive associated bias currents, as generated by respective supply voltage rail-referenced bias current mirror stages. Each bias current mirror stage is comprised of a low voltage MOSFET, having its source-drain path connected in cascade with the source-drain path of an associated high voltage DMOS transistor. The low voltage MOSFET serves to provide predictable tailoring of the geometry ratios of the current mirror to achieve the desired (mirrored) bias currents supplied by the current mirror stages, while associated high voltage DMOS devices provide buffering/isolation with respect to the supply rails.

The collectors of the differentially connected low voltage transistors are coupled by way of relatively high voltage, output-folding devices, in the form of DMOS transistors, to first and second output nodes. The gates of the output-folding DMOS transistors are coupled in common with the gates of turn-on bias voltage supply DMOS transistors which provide a continuous turn-on bias voltage to the gates of the output-folding DMOS transistors, as well as to the gates of respective input voltage-coupling DMOS transistors. The output-folding DMOS transistors have the same channel polarity type as the turn-on bias voltage supply DMOS transistors. As a result, mutually opposite source-gate and gate-source voltage drops in respective loop paths therethrough are equal to one another, thereby producing an accumulated source-gate—gate-source voltage drop of zero volts. This zero accumulation of the gate-source voltage drops, in combination with equal base-emitter voltage drops of associated bipolar voltage level-shift transistors and voltage-offsetting emitter-follower transistors causes the voltages at the base and collector of each of the differential amplifier transistors to be the same, so that there is no effective voltage differential across either of these transistors, irrespective of the magnitude of the input voltage.

The input voltage-coupling DMOS transistors have their source-drain paths coupled between the respective input terminals and input voltage-coupling lines, which are bridged by voltage clamping diodes connected in back-to-back configuration. A respective input voltage line is coupled to the base of a low voltage level-shift bipolar transistor, to the base of a low voltage emitter-follower bipolar transistor, and to the gate of a first, high voltage, source-follower DMOS transistor. The first source-follower DMOS transistor has its drain referenced to one supply rail, and its source coupled in a loop configuration with the gate of a second, high voltage, source-follower DMOS transistor, having a channel polarity that is complementary to that of the first source-follower DMOS transistor, and the drain of which is referenced to the other supply rail. The source of the second source-follower DMOS transistor is connected to the collector of the voltage level-shift transistor and to the collector of the emitter-follower transistor.

Because the first and second source-follower DMOS transistors are of complementary channel types, their gate-source voltages over a path from the input voltage line to the commonly connected collectors of the voltage level-shift transistor and the emitter-follower transistor sum to zero, so that the same voltage (the input voltage coupled to the input voltage-coupling line from the input DMOS transistor) will be seen by the bases and collectors of the low voltage, level-shift transistor and the low voltage, emitter-follower transistor. As a result, there is no effective voltage differential across either of these transistors, irrespective of the magnitude of the input voltage. The emitter of the level-shift transistor is coupled to the source of a respective turn-on bias voltage supply DMOS transistor, while the emitter of the emitter-follower transistor is coupled to the base of a differential amplifier transistor.

The comparator input stage operates as follows. With the current flow paths through the low voltage, level-shift transistor and the turn-on bias DMOS transistor being connected in cascade, there is an accumulated voltage differential corresponding to the sum of the Vbe of the low voltage, level-shift transistor and the Vgs of the turn-on bias DMOS transistor between the source of the input DMOS transistor, to which the base of the level-shift transistor is connected, and the gate of the input DMOS transistor, to which the gate of the turn-on bias DMOS transistor is connected. This voltage differential is sufficiently above the turn-on threshold of the input DMOS transistor, so that the input DMOS transistor is turned-on, thereby coupling the input voltage to the input voltage-coupling line, and thereby to the gate of the first source-follower DMOS transistor and to the bases of the low voltage, level-shift and emitter-follower transistors. In addition, the output-folding, DMOS transistor is biased on, so as to couple the collector of the differentially connected low voltage transistor to its associated output node.

With the input DMOS transistor turned on, the voltage at the input terminal is coupled to the gate of the first source-follower DMOS transistor, and to the bases of the level-shift and emitter-follower transistors. The emitter follow transistor couples the input voltage to the base of the differentially connected bipolar transistor. In response to a difference between the voltage values at the bases of the two differentially connected transistors, the folded-cascade differential amplifier provides a corresponding output drive at its output terminals, as intended.

In order to make the operation of the low voltage (bipolar) transistors effectively immune to the magnitude of the input voltage, it is necessary that there be effectively no substantial differential voltage thereacross, irrespective of the amplitude of the input voltage. This is accomplished with respect to the low voltage, level-shift and emitter-follower transistors by the provision of the complementary channel polarity source-follower DMOS transistors. As pointed out above, because the gate-source path through the first source-follower DMOS transistor is coupled in series with the gate-source path through the second (opposite channel polarity) source-follower DMOS transistor, the gate-source voltages thereof sum to zero over a path from input voltage-coupling line to the collectors of the level-shift and emitter-follower transistors. As a consequence, the input voltage applied through the turned-on input DMOS transistor to the bases of these low voltage transistors is also applied via the complementary channel source-follower DMOS transistors to the collectors thereof, so that there is no effective voltage differential across these low voltage transistors, irrespective of the magnitude of the input voltage.

Protection for the low voltage differential amplifier transistor is achieved as follows. Since the gate of the output-folding DMOS transistor is coupled in common with the gate of the turn-on bias voltage supply DMOS transistor, their gate-source voltage drops in a path therethrough are equal and opposite to one another, so as to realize an accumulated gate-source voltage drop of zero volts between the emitter of the low voltage, level-shift transistor and the collector of the low voltage differential amplifier transistor. Because the base of the low voltage level-shift transistor is connected in common with the base of the emitter-follower transistor, there is a voltage drop of one Vbe between the base of the emitter-follower transistor and the collector of the differential amplifier transistor.

However, because the differential amplifier transistor is connected in emitter-follower configuration to the emitter-follower transistor, the voltage at the base of the differential amplifier transistor is one Vbe below the voltage at the base of the emitter-follower transistor. As a result, the mutually opposing Vbe's through the level-shift and emitter-follower transistors sum to zero, so that there is a net voltage drop of zero across the base and collector of the differential amplifier transistor. Thus, there is no effective voltage differential across any of the low voltage transistors, since the circuit architecture of the comparator causes the voltages across these transistors to effectively 'slide' or translate with the input voltage, and thereby prevents changes in the magnitude of the input voltage from producing a (potential damaging) differential voltage across these devices.

As noted above, the current outputs of the upper and lower comparator input stages are mirrored by associated output current mirror circuits and then summed at the input resistor of a transimpedance amplifier stage. The transimpedance amplifier stage is comprised of an inverter with a resistor connected between its input and output that produces an amplified output representative of the voltage differential across the comparator's inputs, in accordance with the summation of the mirrored currents supplied to the summing input node. The combination of summed current mirror outputs and high gain transimpedance amplifier circuitry enables a small swing in the output of the differential amplifiers of the comparator's upper and lower input stages to provide large output voltage and current drive capability over the full range of variation of the input voltage.

DETAILED DESCRIPTION

Figure 1:
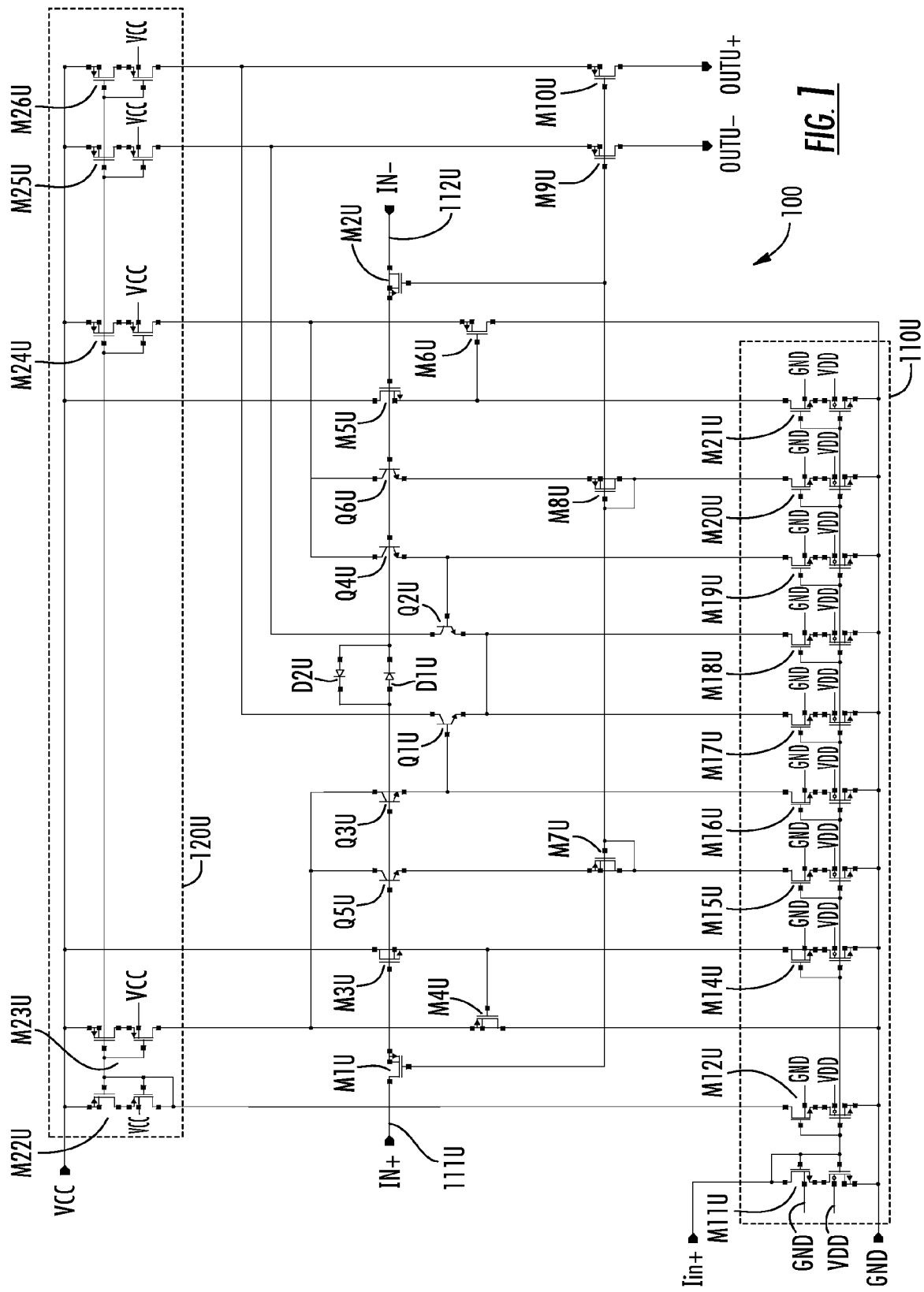
FIG. 1 schematically illustrates the circuit architecture of an upper high voltage level-processing input stage of a high voltage comparator in accordance with present invention.

Attention is initially directed to FIG. 1, wherein a first, or upper (U) high voltage level-processing input stage 100 of the comparator circuit architecture in accordance with present invention is schematically illustrated. As pointed out briefly above, this upper comparator input stage is operative to handle input voltages (applied to differential inputs IN+ and IN−) whose amplitudes are relatively close to, or in the neighborhood of, the relatively large magnitude supply voltage of the upper power supply rail (Vcc—which may be on the order of three to twenty-eight volts, as a non-limiting example). In particular, upper comparator input stage 100 is operative to handle an input voltage lying in a range of from (Vdsat+Vgs+Vbe) to (Vcc−Vdsat), where Vdsat is the drain-source voltage for the saturated condition of an MOS transistor, Vgs is the MOS transistor gate-source voltage, and Vbe is the base-emitter voltage of a bipolar transistor.

Figure 2:
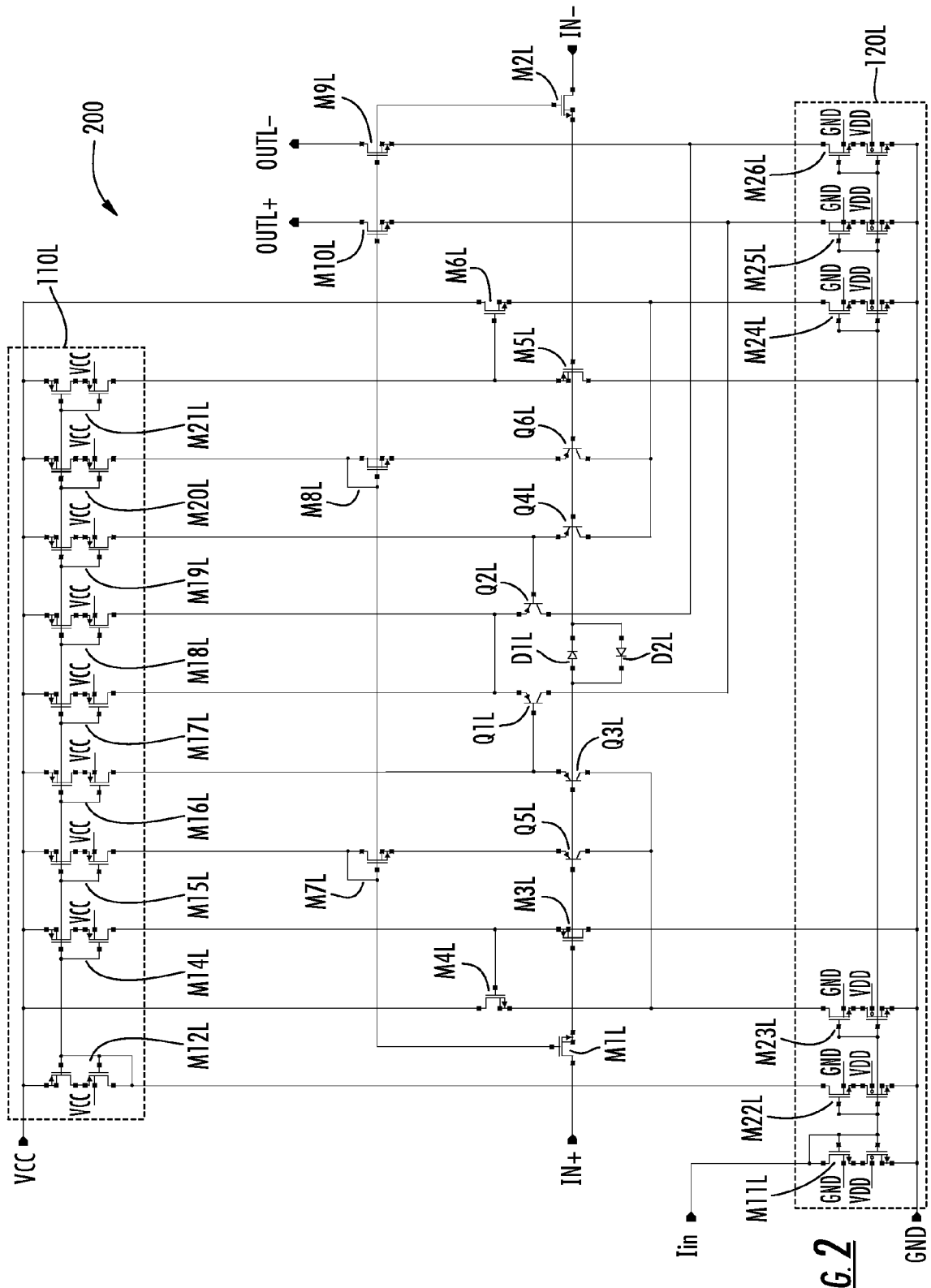
FIG. 2 schematically illustrates the circuit architecture of a lower high voltage level-processing input stage of a high voltage comparator in accordance with present invention.

Connected in parallel with the upper comparator input stage 100 is a second or lower (L), low voltage level-processing input stage, shown schematically at 200 in FIG. 2. The lower (L) comparator input stage 200 is operative to handle input voltages (applied to the same differential inputs IN+ and IN− of the upper input stage 100) whose amplitudes are relatively close to, or in the neighborhood of, the relatively low magnitude supply voltage of the lower power supply rail (ground (GND) or zero volts, as a non-limiting example). Specifically, lower comparator input stage 200 is operative to handle an input voltage lying in a range of from Vdsat to (Vcc−(Vdsat+Vgs+Vbe)).

Figure 3:
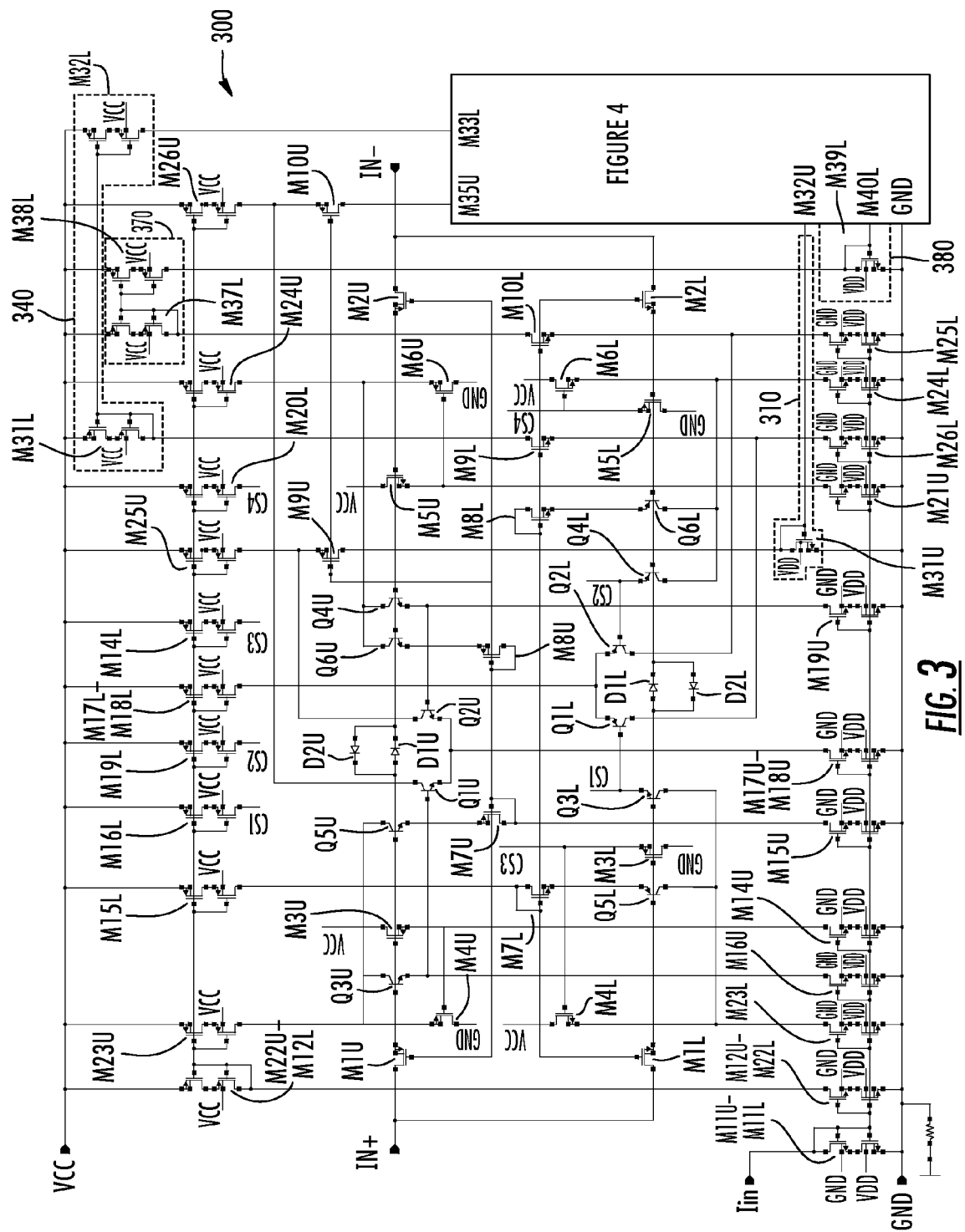
FIGS. 3 and 4, taken together, schematically illustrate the overall circuit architecture of a high voltage comparator in accordance with present invention.
Figure 4:
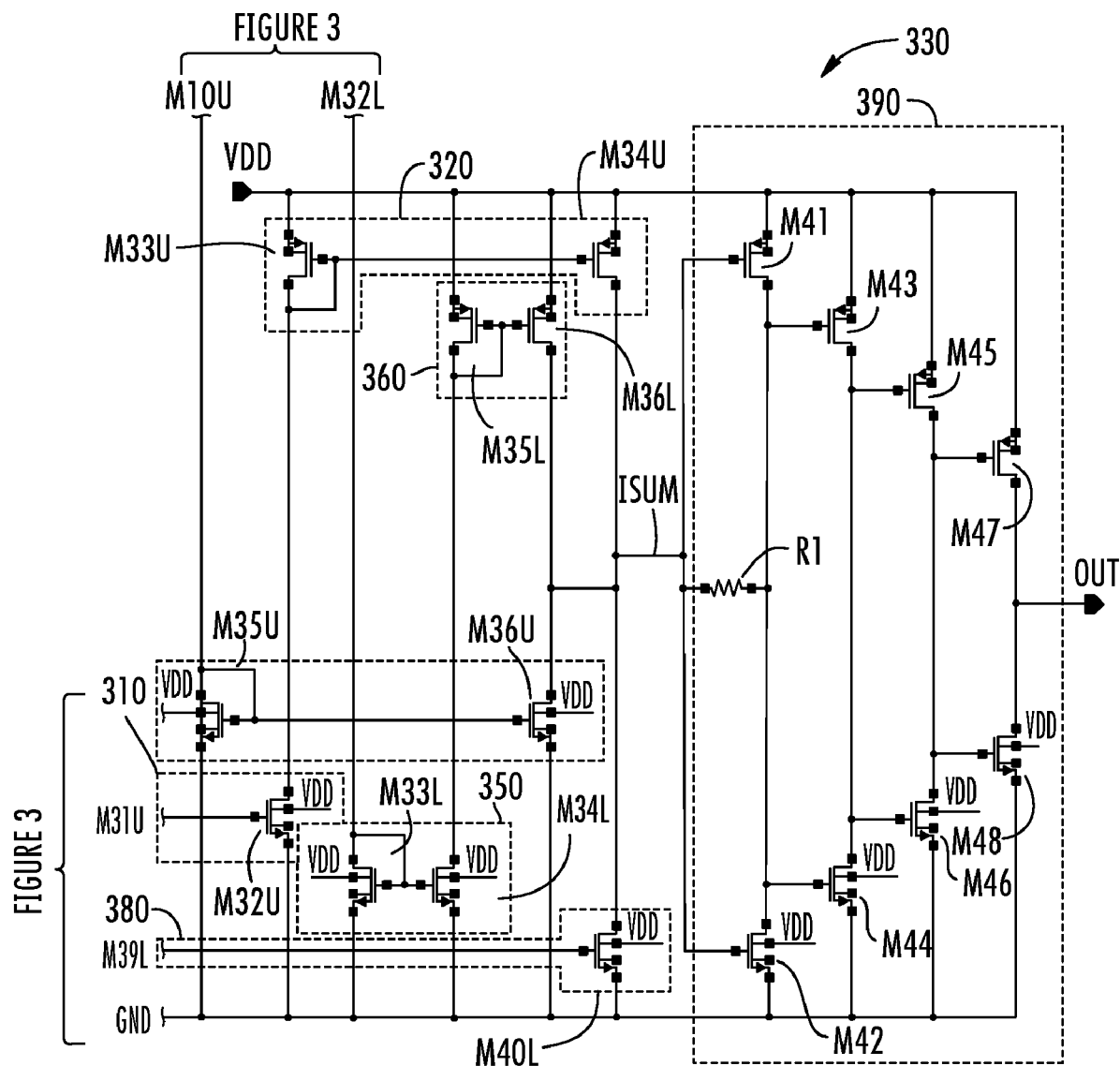

The lower comparator input stage 200 has the same circuit architecture as the upper comparator input stage 100, but is configured of complementary polarity devices (whose alpha-numeric identifiers are appended with the reference letter 'L' to denote that they are contained within or associated with the lower (L) comparator input stage 200), that are referenced to voltage rails complementary to those of the first comparator input stage of FIG. 1 (whose alpha-numeric identifiers are appended with the reference letter 'U' to denote that they are contained within or associated with the upper (U) comparator input stage 100). As such, unless otherwise noted, the following description of the configuration and operation of the circuit architecture of the upper comparator input stage 100 of FIG. 1 is also applicable to the lower comparator input stage 200 of FIG. 2. The outputs of the two comparator input stages 100 and 200 are combined in an output stage, shown schematically at 300 in the composite schematic of FIGS. 3 and 4, to produce an output at an output node OUT.

Referring again to FIG. 1, the upper (U) high voltage level-processing input stage 100 is schematically shown as having first and second input terminals IN+ and IN−, to which the input voltage to the comparator is differentially applied. The basic architecture of the comparator is that of a folded-cascade differential amplifier circuit formed of relatively low voltage, well matched devices—here, bipolar (NPN) transistors—for performing precision differential voltage measurements, and an associated set of high voltage devices that provide protective buffering between the high input voltages and the low voltage devices. Although the low voltage devices are shown as comprising bipolar transistors, other electronically equivalent components, such as low voltage MOSFETs, may be employed instead.

More particularly, the folded-cascade differential amplifier circuit architecture of FIG. 1 is shown as comprising low voltage NPN transistors Q1U and Q2U that are connected in differential amplifier configuration, having their respective emitters connected in common to parallel-connected bias-current sources M17U and M18U of a lower supply voltage rail (GND)-referenced bias current mirror stage 110U. As shown in FIG. 1, each of bias-current sources M17U and M18U, as well as the remaining bias-current sources M12U, M14U-M16U and M19U-M21U of the lower supply voltage rail-referenced bias current mirror stage 110U, is comprised of a low voltage (N-channel) current mirror MOSFET, having the source-drain path thereof connected in cascade with the source-drain path of an associated high voltage (N-channel) current mirror DMOS transistor, and the gates thereof connected in common with the gates of an input current mirror M11U.

Input current mirror M11U is likewise comprised of a low voltage (N-channel) current mirror MOSFET, having the source-drain path thereof connected in cascade with the source-drain path of an associated high voltage (N-channel) current mirror DMOS transistor, between and input reference current terminal Iin and the lower supply rail. In both the lower supply voltage rail (GND)-referenced bias current mirror stage 110U and an upper supply voltage rail (Vcc)-referenced bias current mirror stage 120U, low voltage MOSFETs thereof provide for predictable tailoring of the geometry ratios to achieve the desired (mirrored) bias currents supplied by the current mirror stages, while associated high voltage DMOS devices, that are connected in cascade with the low voltage MOSFETs, provide buffering/isolation with respect to the supply rails.

The collector of transistor Q1U is coupled to the source of a first output-folding, relatively high voltage device, shown as a (P-channel) DMOS transistor M10U, the drain of which is coupled to a first (+) output node OUTU+, while the collector of transistor Q2U is coupled to the source of a second output-folding, relatively high voltage device, shown as a (P-channel) DMOS transistor M9U, the drain of which is coupled to a second (−) output node OUTU−.

The commonly connected source of DMOS transistor M10U and collector of transistor Q1U are coupled to a (MOSFET implemented) bias-current source M26U of the bias-current mirror stage 120U, while the commonly connected source of DMOS transistor M9U and collector of transistor Q2U are connected to a (MOSFET implemented) bias-current source M25U of bias current mirror stage 120U. Similar to the configuration of the lower supply voltage rail-referenced bias current mirror stage 110U, each of bias-current sources M23U-M26U of the upper supply voltage rail -referenced bias-current mirror stage 120U is comprised of a low voltage (P-channel) current mirror MOSFET, having the source-drain path thereof connected in cascade with the source-drain path of an associated high voltage (P-channel) current mirror DMOS transistor, and the gates thereof connected in common with the gates of an input current mirror M22U. The input current mirror M22U of the bias-current mirror stage 120U is connected to receive an input current from the bias-current mirror M12U of the bias-current mirror stage 110U.

The gates of (P-channel) output-folding, DMOS transistors M9U and M10U are coupled in common with the gates of turn-on bias voltage supply (P-channel) DMOS transistors M7U and M8U which, as will be described, serve to provide a continuous turn-on bias voltage to the gates of output-folding DMOS transistors M9U and M10U, as well as to the gates of respective input voltage-coupling (P-channel) DMOS transistors M1U and M2U. Moreover, because output-folding DMOS transistors M9U and M10U have the same channel polarity type (P-channel) as turn-on bias voltage supply DMOS transistors M7U and M8U, mutually opposite source-gate and gate-source voltage drops in respective loop paths therethrough are equal to one another, so as to realize an accumulated source-gate—gate-source voltage drop of zero volts.

As will be described, this zero accumulation of the gate-source voltage drops, in combination with equal base-emitter voltage drops of associated level-shift bipolar (NPN) transistors Q5U and Q6U and emitter-follower transistors Q3U and Q4U, causes the voltages at the base and collector of transistor Q1U to be the same, and the voltages at the base and collector of transistor Q2U to be the same. As a consequence, there is no effective voltage differential across either of the transistors Q1U and Q2U, irrespective of the magnitudes of the input voltages applied to the input terminals IN+ and IN−.

Input voltage-coupling DMOS transistor M1U has its source-drain path coupled to the input terminal IN+ on a +input voltage-coupling line 111U, while input voltage-coupling DMOS transistor M2U has its source-drain path coupled to the input terminal IN− on a −input voltage-coupling line 112U. Voltage clamping diodes D1U and D2U are connected in back-to-back configuration between input voltage-coupling lines 111U and 112U.

The +input voltage line 111U is coupled to the gate of a first source-follower (N-channel) DMOS transistor M3U, to the base of level-shift bipolar (NPN) transistor Q5U, and to the base of a (Vbe) voltage-offsetting, emitter-follower bipolar (NPN) transistor Q3U. As will be described, this transistor and emitter-follower transistor Q4U are used to offset the voltage inputs to the bases of differential amplifier transistors Q1U and Q2U by one Vbe relative to the ±input voltage lines 111U and 112U, respectively, so as to compensate for the one Vbe voltage drop across the base-emitter junctions of transistors Q5U and Q6U between the ±input voltage lines 111U and 112U and the source terminals of bias DMOS transistors M7U and M8U.

The −input voltage line 112U is coupled to the gate of a second source-follower DMOS transistor M5U, to the base of level-shift bipolar (NPN) transistor Q6U, and to the base of an emitter-follower bipolar (NPN) transistor Q4U. The source of the first (N-channel) source-follower DMOS transistor M3U, the drain of which is referenced to the upper supply rail Vcc, is coupled in a loop configuration with the gate of a third (P-channel) source-follower DMOS transistor M4U, the drain of which is referenced to the lower supply rail (GND), and the source of which is connected to the collectors of transistors Q3U and Q5U.

As will be described, because source-follower DMOS transistors M3U and M4U are of complementary channel types, the sequential gate-source voltages thereof, over a path or loop from the +input voltage line 111U to the collectors of transistors Q3U and Q5U, sum to zero, so as to effectively cause the same voltage (that applied to input terminal IN+) to be seen by the bases and collectors of transistors Q3U and Q5U. As a result, there is no effective voltage differential across transistors Q3U and Q5U, irrespective of the magnitude of the input voltage applied to input terminal IN+.

The source of the first source-follower DMOS transistor M3U is further connected to a (MOSFET implemented) bias-current source M14U of bias current mirror stage 110U, while the source of the third source-follower DMOS transistor M4U is further connected to a (MOSFET implemented) bias-current source M23U of bias current mirror stage 120U. It is also coupled to the collectors of transistors Q3U and Q5U. The emitter of level-shift bipolar transistor Q5U is coupled to the source of turn-on bias voltage supply DMOS transistor M7U, the drain and gate of which are connected in common to a (MOSFET implemented) bias-current source M15U of the bias current mirror stage 110U. The emitter of emitter-follower transistor Q3U is coupled to the base of transistor Q1U, and to a (MOSFET implemented) bias-current source M16U of the bias current mirror stage 110U.

In a like manner, the source of the second (N-channel) source-follower DMOS transistor M5U, the drain of which is referenced to the upper supply rail Vcc, is coupled in a loop configuration with the gate of a fourth (P-channel) source-follower DMOS transistor M6U, the drain of which is referenced to the lower supply rail (GND), and the source of which is connected to the collectors of transistors Q4U and Q6U. As in the case of the respective first and third source-follower transistors M3U and M4U, described above, because the second and fourth source-follower DMOS transistors M5U and M6U, respectively, are of complementary channel types, the gate-source voltages thereof, over a sequential path or loop from the −input voltage line 112U to the collectors of transistors Q4U and Q6U, sum to zero and thereby effectively cause the same voltage (that applied to input terminal IN−) to be seen by the bases and collectors of transistors Q4U and Q6U. As a consequence, there is no effective voltage differential across transistors Q4U and Q6U, irrespective of the magnitude of the input voltage applied to input terminal IN−.

The source of the second source-follower DMOS transistor M5U is further connected to a (MOSFET implemented) bias-current source M21U of bias current mirror stage 110U, while the source of the fourth source-follower DMOS transistor M6U is further connected to a (MOSFET implemented) bias-current source M24U of bias current mirror stage 120U, and to the collectors of transistors Q4U and Q6U. The emitter of level-shift bipolar transistor Q6U is coupled to the source of turn-on bias voltage supply DMOS transistor M8U, the drain and gate of which are connected in common to a (MOSFET implemented) bias-current source M20U of the bias current mirror stage 110U. The emitter of emitter-follower transistor Q4U is coupled to the base of transistor Q2U, and to a (MOSFET implemented) bias-current source M19U of the bias current mirror stage 110U.

The upper (U) high voltage level-processing input stage 100 of the comparator circuit architecture of FIG. 1 operates as follows. With the current flow path through level-shift bipolar transistor Q5U and turn-on bias DMOS transistor M7U being connected in cascade between bias-current sources M23U and M15U, there is an accumulated voltage differential corresponding to the sum of the Vbe (e.g., on the order of 0.7 VDC) of low voltage bipolar transistor Q5U and the Vgs (on the order of 1.0 VDC) of DMOS transistor M7U between the source of input DMOS transistor M1U (to which the base of transistor Q5U is connected) and the gate of input DMOS transistor M1U (to which the gate of DMOS transistor M7U is connected). This voltage differential is on the order of one volt above the turn-on threshold of input DMOS transistor M2U, so that DMOS transistor M1U is turned-on, thereby coupling the input voltage at input terminal IN+ to the +input line 111U, and thereby to the gate of source-follower DMOS transistor M3U and to the bases of bipolar transistors Q5U and Q3U.

Similarly, with the current flow path through bipolar transistor Q6U and DMOS transistor M8U being connected in cascade between bias-current sources M24U and M20U, there is an accumulated voltage differential corresponding to the sum of the Vbe of low voltage bipolar transistor Q6U and the Vgs of DMOS transistor M8U between the source of input DMOS transistor M2U (to which the base of transistor Q6U is connected) and the gate of input DMOS transistor M2U (to which the gate of DMOS transistor M8U is connected). This voltage differential causes DMOS transistor M2U to be turned-on, thereby coupling the input voltage at input terminal IN− to the −input line 112U, and thereby to the gate of source-follower DMOS transistor M5U and to the base of bipolar transistors Q6U and Q4U. In addition, with the gates of DMOS transistors M7U and M8U being connected in common with the gates of output-folding, DMOS transistors M9U and M10U, DMOS transistors M9U and M10U are biased on, so as to couple the collectors of bipolar transistors Q1U and Q2U to respective output nodes OUTU+ and OUTU−, as described above.

With input DMOS transistors M1U and M2U turned on, the respective voltages at input terminals IN+ and IN− are coupled therethrough and applied to the gates of source-follower DMOS transistors M3U and M5U, and to the bases of bipolar transistors Q3U and Q5U and to the bases of bipolar transistors Q4U and Q6U, respectively. Emitter follow transistor Q3U couples the input voltage at input terminal IN+ to the base of bipolar transistor Q1U, while emitter follow transistor Q4U couples the input voltage at input terminal IN− to the base of bipolar transistor Q2U. In response to a difference between these voltage values, the differential amplifier provides a corresponding output drive at output terminals OUTU+ and OUTU−, as intended.

In order to make the operation of the low voltage (bipolar) differential amplifier Q1U and Q2U effectively immune to the magnitude of the input voltage, it is necessary that there be effectively no substantial differential voltages thereacross, irrespective of the amplitude of the input voltage. This objective is accomplished with respect to bipolar transistors Q3U and Q5U by the provision of source-follower DMOS transistors M3U and M4U, and with respect to bipolar transistors Q4U and Q6U by the provision of source-follower DMOS transistors M5U and M6U. Because the gate-source path through N-channel DMOS transistor M3U is coupled in series with the gate-source path through P-channel DMOS transistor M4U, as described above, the gate-source voltages thereof sum to zero over a path from +input voltage line 111U to the collectors of transistors Q3U and Q5U. As a consequence, the input voltage applied through turned-on input DMOS transistor M1U to the bases of transistors Q3U and Q5U, is also effectively coupled via source-follower DMOS transistors M3U and M4U to the collectors thereof, so that there is no voltage differential across transistors Q3U and Q5U, irrespective of the magnitude of the input voltage applied to input terminal IN+.

Likewise, because the gate-source path through N-channel DMOS transistor M5U is coupled in series with the gate-source path through P-channel DMOS transistor M6U, the gate-source voltages thereof sum to zero over a path from the −input voltage line 112U to the collectors of transistors Q4U and Q6U. As a result, the input voltage applied through turned-on input DMOS transistor M2U to the bases of transistors Q4U and Q6U, is also applied via source-follower DMOS transistors M5U and M6U to the collectors thereof, so that there is no effective voltage differential across transistors Q4U and Q6U, irrespective of the magnitude of the input voltage applied to input terminal IN−. In other words, the voltages at the bases and collectors of low voltage bipolar transistors Q3U/Q5U and Q4U/Q6U will effectively 'slide' or translate with the input voltages applied to respective input terminals IN+ and IN−, so that changes in the magnitudes of the input voltage cannot produce a (potential damaging) differential voltage across these low voltage transistors.

Protection for the differential amplifier transistors Q1U and Q2U is achieved as follows. As described above, the gates of (P-channel) DMOS transistors M9U and M10U are coupled in common with the gates of turn-on bias voltage supply (P-channel) DMOS transistors M7U and M8U. As a result, the gate-source voltage drops thereacross are mutually opposite to one another, so that gate-source voltage drops in respective loop paths therethrough are equal and opposite to one another, so as to realize an accumulated gate-source voltage drop of zero volts between the emitter of bipolar transistor Q5U and the collector of bipolar transistor Q1U, as well as an accumulated gate-source voltage drop of zero volts between the emitter of bipolar transistor Q6U and the collector of bipolar transistor Q2U. Because the base of bipolar transistor Q5U is connected in common with the base of emitter-follower transistor Q3U, there is a voltage drop of one Vbe between the base of emitter-follower transistor Q3U and the collector of differential amplifier transistor Q1U. Likewise, because the base of bipolar transistor Q6U is connected in common with the base of emitter-follower transistor Q4U, there is a voltage drop of one Vbe between the base of emitter-follower transistor Q4U and the collector of differential amplifier transistor Q2U.

However, because differential amplifier transistor Q1U is connected in emitter-follower configuration to transistor Q3U, the voltage at the base of differential amplifier transistor Q1U is one Vbe below the voltage at the base of emitter-follower transistor Q3U. Likewise, because differential amplifier transistor Q2U is connected in emitter-follower configuration to transistor Q4U, the voltage at the base of differential amplifier transistor Q2U is one Vbe below the voltage at the base of emitter-follower transistor Q2U. As a result, the mutually opposing Vbe's through transistors Q3U and Q5U and the mutually opposing Vbe's through transistors Q4U and Q6U sum to zero, so that there is a net voltage drop of zero across the base and collector of differential amplifier transistor Q1U and across the base and collector of differential amplifier transistor Q2U. Namely, like low voltage bipolar transistors Q3U, Q5U, Q4U and Q6U, there is no effective voltage differential across either of the transistors Q1U and Q2U, as the voltages across these transistors effectively 'slide' or translate with these input voltages, and thereby prevent changes in the magnitudes of the input voltage from producing a (potential damaging) differential voltage across transistors Q1U and Q2U.

As described above, the lower comparator input stage 200, schematically illustrated in FIG. 2, is connected in parallel with the upper comparator input stage 100, and has the same circuit architecture as the upper comparator input stage 100 of FIG. 1, except that it is configured of components (whose alpha-numeric identifiers are appended with the reference letter 'L' to denote that they are contained within or associated with the lower (L) comparator input stage 200) whose polarities are complementary to those of the components of FIG. 1, and are referenced to voltage supply rails complementary to the supply rail connections of the first comparator input stage of FIG. 1.

Being connected in parallel with the upper comparator input stage 100 means that the inputs of the lower comparator input stage 200, namely, the source-drain paths of its input DMOS transistors M1L and M2L, are connected to the same respective input terminals IN+ and IN− to which source-drain paths of input DMOS transistors M1U and M2U of the upper comparator input stage 100 are connected. However, the lower comparator input stage 200 has separate OUTL+ and OUTL− nodes, to which the source-drain paths of output-folding, DMOS transistors M10L and M9L are respectively connected. As will be described below with reference to FIGS. 3 and 4, output currents provided at these two sets of output nodes OUTU+/OUTU− and OUTL+/OUTL− are mirrored by associated output current mirror circuits and then summed at an input resistor of a transconductance amplification output stage to provide an amplified output current representative of the voltage differential across the comparator's inputs IN+ and IN−.

As such, the configuration and operation of the circuit architecture of the lower comparator input stage 200 of FIG. 2 may be readily understood from the foregoing detailed description of the upper comparator input stage 100 of FIG. 1. Therefore, to avoid what would otherwise essentially amount to a duplication of text, a separate detailed description of the circuit schematic of FIG. 2 will not be presented. Instead, the following description will detail the manner in which the outputs of the upper and lower comparator input stages 100 and 200 of FIGS. 1 and 2 are combined in the output stage 300 of the schematic of FIGS. 3 and 4, which, taken together, are a composite of the schematics of FIGS. 1 and 2, plus the output stage.

More particularly, as described above, the output currents provided at the output nodes OUTU+/OUTU− of the upper comparator input stage 100 and at the output nodes OUTL+/OUTL− of the lower comparator input stage 200 are mirrored by associated output current mirror circuits and then summed at the input resistor of a transconductance amplification output stage to provide, at comparator output node OUT, an amplified output current representative of the voltage differential across the comparator's inputs IN+ and IN−.

For this purpose, the output node OUTU− of the upper comparator stage 100, to which the drain of output-folding, DMOS transistor M9U is coupled, is connected to a low voltage current mirror 310. Current mirror 310 is comprised of a diode-connected, low voltage, input MOSFET M31U, referenced to ground and connected in current mirror configuration with a low voltage output MOSFET M32U, also referenced to ground, and having the drain thereof supplying a mirrored current to a low voltage current mirror 320. Low voltage current mirror 320 comprises a diode-connected, low voltage, input MOSFET M33U, referenced to a voltage supply rail (Vdd), and connected in current mirror configuration with a low voltage, output MOSFET M34U, also referenced to Vdd, and having the drain thereof supplying a mirrored current to a mirrored current summing node ISUM. In a similar manner, the upper comparator stage's output node OUTU+, to which the drain of output-folding, DMOS transistor M10U is coupled, is connected to a low voltage current mirror 330. Current mirror 330 comprises a diode-connected, low voltage, input MOSFET M35U, referenced to ground and connected in current mirror configuration with a low voltage, output MOSFET M36U, also referenced to ground, and having the drain thereof supplying a mirrored current to mirrored current summing node ISUM.

For the lower comparator input stage 200, its output node OUTL−, to which the drain of output-folding, DMOS transistor M9L is coupled, is connected to the current mirror input stage M31L of a current mirror 340. Current mirror input stage M31L is comprised of a low voltage MOSFET, having the source-drain path thereof connected in cascade with the source-drain path of an associated high voltage DMOS transistor between the upper voltage supply rail Vcc and the output node OUTL−. The gates of these cascaded low voltage and high voltage MOS transistors are connected in common to the output node OUTL− and to commonly connected gates of cascaded MOS transistors of a current mirror output stage M32L. Like current mirror input stage M31L, current mirror output stage M32L is comprised of low voltage current mirror MOSFET, referenced to the upper supply rail Vcc, and having the source-drain path thereof connected in cascade with the source-drain path of an associated high voltage current mirror DMOS transistor, which supplies a mirrored current to a current mirror output stage 350.

As in the case of the bias current mirror stages 110U, 110L and 120U, 120L of the upper and lower comparator input stages 100 and 200, described above, in the current mirror 340 (and also a current mirror 370, to be described), the low voltage MOSFETs thereof provide for predictable tailoring of the geometry ratios to achieve the desired (mirrored) bias currents supplied by the current mirror stages, while their associated high voltage DMOS devices, that are connected in cascade with the low voltage MOSFETs, provide buffering/isolation with respect to the Vcc supply rail.

Current mirror 350 comprises a diode-connected, low voltage, input MOSFET M33L, referenced to ground and connected in current mirror configuration with a low voltage, output MOSFET M34L, also referenced to ground, and having the drain thereof supplying a mirrored current to a further current mirror 360. This further current mirror 360 comprises a diode-connected, low voltage, input MOSFET M35L, referenced to Vdd and connected in current mirror configuration with a low voltage, output MOSFET M36L, which is also referenced to Vdd, and has the drain thereof supplying a mirrored current to the mirrored current summing node ISUM.

The lower comparator stage's output node OUTL+, to which the drain of output-folding, DMOS transistor M10L is coupled, is connected to the current mirror input stage M37L of a current mirror 370. Current mirror input stage M37L is comprised of a low voltage MOSFET, having the source-drain path thereof connected in cascade with the source-drain path of an associated high voltage DMOS transistor between the upper voltage supply rail Vcc and the output node OUTL+. The gates of these cascaded low voltage and high voltage MOS transistors are connected in common to the output node OUTL+ and to commonly connected gates of cascaded MOS transistors of a current mirror output stage M38L. Current mirror output stage M38L is comprised of low voltage current mirror MOSFET, referenced to the upper supply rail Vcc, and having the source-drain path thereof connected in cascade with the source-drain path of an associated high voltage current mirror DMOS transistor, which supplies a mirrored current to a further, low voltage current mirror 380. This low voltage current mirror 380 comprises a diode-connected, low voltage, input MOSFET M39L, referenced to ground, and connected in current mirror configuration with a low voltage, output MOSFET M40L, also referenced to ground, and having the drain thereof supplying a mirrored current to the mirrored current summing node ISUM.

Mirrored current summing node ISUM is coupled to the gates of DMOS transistors M41 and M42 of a high gain, transimpedance amplifier 390, comprised of successively cascaded DMOS transistor amplifier circuits, the output of which is coupled to the output node OUT. In particular, the source-drain paths of DMOS transistors M41 and M42 of a first DMOS inverter/amplifier circuit stage of transimpedance amplifier 390 are connected between the voltage supply rails Vdd and ground. A resistor R1, is connected between the current summing node ISUM and the common drain connection between DMOS transistors M41 and M42. In response to the mirrored currents summed at summing node ISUM, a voltage is developed across resistor R1 in proportion to the sum of the mirrored currents output by the respective upper and lower comparator input stage 100 and 200. This voltage across resistor R1 provides the input drive to the DMOS transistors M43 and M44 of the DMOS inverter circuit stage, which produces an output voltage that is successively amplified by the downstream cascaded DMOS inverter circuit stages of transimpedance amplifier 390, namely, respective DMOS transistor pairs M43/M44, M45/M46 and M47/M48, that are connected in inverter configuration between the supply rails Vdd and ground. The commonly connected drains of DMOS transistors M47 and M48 of the last or terminal inverter output stage supply an amplified output voltage and current drive capability to the comparator output node OUT. This combination of summed current mirror outputs and high gain transimpedance amplifier circuitry enables a small swing in the output of the differential amplifiers of the upper and lower comparator input stages to provide large output current drive capability over the full range of input voltage variation (between Vdsat and (Vcc-Vsat)).

As will be appreciated from the foregoing description, the need for a comparator architecture that is able to handle high input voltages, while being able to monitor relatively small variations in such voltages with the sensitivity and precision that is currently available only in low voltage implementations is successfully realized in accordance with the present invention, which employs low voltage devices to perform precision differential measurements on high input voltages, and high voltage devices to provide protective buffering/isolation between the high input voltages and the low voltage devices. The low voltage and high voltage devices are connected in a configuration that allows the operating levels of the low voltage devices to move up and down or 'slide' with variations in the magnitude of the high input voltage being monitored, and thereby prevents application of a voltage thereacross greater than the relatively small range of variation that can be sustained by the low voltage devices.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. A voltage comparator comprising:
    first and second input terminals to which an input voltage, having a first range of potential variation, is differentially applied;
    a differential amplifier circuit configured of low voltage devices and high voltage devices, said low voltage devices being unable to sustain a voltage thereacross greater than a second range of variation, said second range being less than said first range, and being connected in a circuit configuration that is operative to perform a differential voltage measurement on said input voltage applied to said first and second input terminals and to provide an output in accordance therewith, said high voltage devices being able to sustain a voltage thereacross of said first range, said high voltage devices being interconnected with said low voltage devices so as to provide high input protective buffering for said low voltage devices, said differential amplifier circuit comprises
        first and second controlled high voltage input-coupling devices respectively coupled to said first and second input terminals on first and second input voltage-coupling lines, and a folded-cascade differential amplifier containing first and second low voltage transistors connected in differential configuration and having control electrodes thereof respectively coupled by way of first and second low voltage coupling devices to said first and second input voltage-coupling lines, and having output electrodes thereof respectively coupled by way of first and second output-folding high voltage coupling devices to first and second output nodes, and wherein said differential amplifier circuit causes operating levels of said low voltage devices to move up and down with a variation in said input voltage, and thereby prevents application of a voltage across said low voltage devices greater than said second range of variation.

2. The comparator according to claim 1, wherein said low voltage devices comprise low voltage bipolar transistors or low voltage metal oxide semiconductor (MOS) transistors, and said high voltage devices comprise double diffused metal oxide semiconductor (DMOS) devices.

3. The comparator according to claim 1, wherein said differential amplifier circuit further comprises first and second high voltage biasing devices, respectively coupled to said first and second controlled high voltage input-coupling devices and said first and second output-folding high voltage coupling devices, and being operative to provide a turn-on bias to said first and second controlled high voltage input-coupling devices and said first and second output-folding high voltage coupling devices, so that said first and second controlled high voltage input-coupling devices are respectively coupled to said first and second input terminals on said first and second input voltage-coupling lines, and said first and second output-folding high voltage coupling devices respectively couple said output electrodes of said first and second low voltage transistors to said first and second output nodes.

4. The comparator according to claim 3, wherein said differential amplifier circuit further comprises first and second low voltage, voltage level-shifting devices, respectively coupled to said first and second high voltage biasing devices, and being operative to provide voltage level offsets between said first and second input voltage-coupling lines and said first and second high voltage biasing devices that are effective to cause said first and second high voltage biasing devices to provide said turn-on bias to said first and second controlled high voltage input-coupling devices and said first and second output-folding high voltage coupling devices.

5. The comparator according to claim 4, wherein said first and second low voltage coupling devices respectively comprise first and second low voltage, voltage-offsetting devices, respectively coupled to said control electrodes of said first and second low voltage transistors, and being operative to offset voltage inputs to said control electrodes of said first and second low voltage transistors by first and second voltage drops through said first and second low voltage, voltage level-shifting devices between said first and second input voltage-coupling lines and said first and second high voltage biasing devices.

6. The comparator according to claim 5, wherein said differential amplifier circuit further comprises first and second complementary polarity high voltage, voltage-follower devices, respectively coupled to said first low voltage, voltage level-shifting device and said first low voltage, voltage-offsetting device, and third and fourth complementary polarity high voltage, voltage-follower devices, to coupled to said second low voltage, voltage level-shifting device and said second low voltage, voltage-offsetting device.

7. The comparator according to claim 6, wherein said high voltage devices comprise DMOS transistors, and said low voltage devices comprise bipolar transistors, said first and second low voltage, voltage-offsetting devices comprise first and second emitter-follower transistors, and said high voltage, voltage-follower devices comprise source-follower DMOS transistors.

8. The comparator according to claim 1, farther comprising an output current mirror circuit coupled to said first and second output nodes and a transconductance amplifier circuit, that is operative to produce an amplified output current representative of the voltage differential across said first and second input terminals, in accordance with a summation of currents mirrored by said output current mirror circuit from currents at said first and second output nodes.

9. A voltage comparator comprising:
first and second input terminals to which an input voltage, having a first range of potential variation, is differentially applied;
an upper voltage comparator input stage having first and second inputs thereof respectively coupled to said first and second input terminals, and first and second output nodes;
a lower voltage comparator input stage having first and second inputs thereof respectively coupled to said first and second input terminals, and first and second output nodes; and
a comparator output stage, coupled to said first and second output nodes of said upper voltage comparator input stage and to said first and second output nodes of said lower voltage comparator input stage, and being operative to produce an output representative of the voltage differential across said first and second input terminals, in accordance with a combination of currents derived from currents at said first and second output nodes of said upper voltage comparator input stage and currents at said first and second output nodes of said lower voltage comparator input stage;
wherein each of said upper and lower voltage comparator input stages comprises a respective differential amplifier circuit connected to an upper voltage supply rail and a lower voltage supply rail having a voltage difference therebetween at least equal to said first range, and configured of low voltage devices and high voltage devices, said low voltage devices being unable to sustain a voltage thereacross greater than a second range of variation that is less than said first range, and being connected in a circuit configuration that is operative to perform a differential voltage measurement on said input voltage applied to said first and second input terminals and to provide an output in accordance therewith, said high voltage devices being able to sustain a voltage thereacross of said first range, said high voltage devices being interconnected with said low voltage devices so as to provide high input protective buffering for said low voltage devices, said respective differential amplifier circuit of each of said upper voltage comparator input stage and said lower voltage comparator input stage comprises
first and second controlled high voltage input-coupling devices coupled to said first and second input terminals on first and second input voltage-coupling lines,
a folded-cascade differential amplifier containing first and second low voltage transistors connected in differential configuration and having control electrodes thereof respectively coupled to said first and second input voltage-coupling lines, and having output electrodes thereof respectively coupled by way of first and second output-folding high voltage coupling devices to first and second output nodes, first and second low voltage coupling devices respectively coupling said first and second input voltage-coupling lines to said control electrodes of said first and second low voltage transistors, and wherein each said differential amplifier circuit causes operating levels of said low voltage devices to move up and down with a variation in said input voltage, and thereby prevents application of a voltage across said low voltage devices greater than said second range of variation; and wherein said upper comparator input stage is operative to perform a differential voltage measurement on said input voltage whose amplitude is closer to the voltage of said upper voltage supply rail than to the voltage of said lower voltage supply rail, and said lower comparator input stage is operative to perform a differential voltage measurement on said input voltage whose amplitude is closer to the voltage of said lower voltage supply rail than to the voltage of said upper voltage supply rail.

10. The comparator according to claim 9, wherein said low voltage devices comprise low voltage bipolar transistors or low voltage metal oxide semiconductor (MOS) devices, and said high voltage devices comprise double diffused metal oxide semiconductor (DMOS) devices.

11. The comparator according to claim 9, wherein said respective differential amplifier circuit further comprises:

first and second high voltage biasing devices, respectively coupled to said first and second controlled high voltage input-coupling devices and said first and second output-folding high voltage coupling devices, and being operative to provide a turn-on bias to said first and second controlled high voltage input-coupling devices and said first and second output-folding high voltage coupling devices, so that said first and second controlled high voltage input-coupling devices are respectively coupled to said first and second input terminals on said first and second input voltage-coupling lines, and said first and second output-folding high voltage coupling devices respectively couple said output electrodes of said first and second low voltage transistors to said first and second output nodes;

first and second low voltage, voltage level-shifting devices, respectively coupled to said first and second high voltage biasing devices, and being operative to provide voltage level offsets between said first and second input voltage-coupling lines and said first and second high voltage biasing devices, that are effective to cause said first and second high voltage biasing devices to provide said turn-on bias to said first and second controlled high voltage input-coupling devices and said first and second output-folding high voltage devices;

first and second low voltage, voltage-offsetting devices, respectively coupled to said control electrodes of said first and second low voltage transistors, and being operative to offset voltage inputs to said control electrodes of said first and second low voltage transistors by first and second voltages through said first and second low voltage, voltage level-shifting devices between said first and second input voltage-coupling lines and said first and second high voltage biasing devices; and first and second complementary polarity high voltage, voltage-follower devices, coupled to said first low voltage, voltage level-shifting device and said first low voltage, voltage-offsetting device, and third and fourth complementary polarity high voltage, voltage-follower devices, coupled to said second low voltage, voltage level-shifting device and said second low voltage, voltage-offsetting device.

12. The comparator according to claim 9, wherein said comparator output stage comprises an output current mirror circuit coupled to said first and second output nodes of said upper and lower comparator input stages and a transimpedance amplifier, said transimpedance amplifier being operative to produce an amplified output voltage representative of the voltage differential across said first and second input terminals, in accordance with a summation of currents mirrored by said output current mirror circuit from currents at said first and second output nodes of said upper and lower comparator input stages.

13. A method of differentially measuring an input voltage having a first range of potential variation comprising the steps of:

(a) differentially coupling said input voltage across first and second input terminals;

(b) coupling respective first and second input nodes of a differential amplifier circuit to said first and second input terminals, said differential amplifier circuit being configured of low voltage devices that are unable to sustain a voltage thereacross greater than a second range of variation less than said first range, and being connected in a circuit configuration that is operative to perform a differential voltage measurement on said input voltage applied to said first and second input nodes and to provide an output in accordance therewith, said differential amplifier circuit comprises a folded-cascade differential amplifier containing first and second low voltage transistors connected in differential configuration and having control electrodes thereof respectively coupled by way of first and second low voltage coupling devices to first and second input voltage-coupling lines; and (c) interconnecting, with said low voltage devices, high voltage devices that are able to sustain a voltage thereacross of said first range, so as to provide high input protective buffering for said low voltage devices by coupling respective first and second controlled high voltage input-coupling devices to said first and second input terminals on first and second input voltage-coupling lines, and coupling respective output electrodes of said differential amplifier circuit by way of first and second output-folding high voltage coupling devices to first and second output nodes, and cause operating levels of said low voltage devices to move up and down with a variation in said input voltage, and thereby prevent application of a voltage across said low voltage devices greater than said second range of variation.

14. The method according to claim 13, wherein said low voltage devices comprise low voltage bipolar transistors or low voltage metal oxide semiconductor (MOS) transistors, and said high voltage devices comprise double diffused metal oxide semiconductor (DMOS) devices.

15. The method according to claim 13 wherein step (c) further comprises respectively coupling first and second high voltage biasing devices to said first and second controlled high voltage input-coupling devices and said first and second output-folding high voltage coupling devices, and causing said first and second high voltage biasing devices to provide a turn-on bias to said first and second controlled high voltage input-coupling devices and said first and second output-folding high voltage coupling devices, so that said first and second controlled high voltage input-coupling devices are respectively coupled to said first and second input terminals on said first and second input voltage-coupling lines, and said first and second output-folding high voltage coupling devices respectively couple said output electrodes of said first and second low voltage transistors to said first and second output nodes.

16. The method according to claim 15, wherein said differential amplifier circuit further comprises first and second low voltage, voltage level-shifting devices, respectively coupled to said first and second high voltage biasing devices, and being operative to provide voltage level offsets between said first and second input voltage-coupling lines and said first and second high voltage biasing devices that are effective to cause said first and second high voltage biasing devices to provide said turn-on bias to said first and second controlled high voltage input-coupling devices and said first and second output-folding high voltage coupling devices.

17. The method according to claim 16, wherein said first and second low voltage coupling devices respectively comprise first and second low voltage, voltage-offsetting devices, respectively coupled between said first and second input voltage-coupling lines and said control electrodes of said first and second low voltage transistors, and being operative to offset voltage inputs to said control electrodes of said first and second low voltage transistors by first and second voltage drops through said first and second low voltage, voltage level-shifting devices between said first and second input voltage-coupling lines and said first and second high voltage biasing devices.

18. The method according to claim 17, wherein said differential amplifier circuit further comprises first and second complementary polarity high voltage, voltage-follower devices, coupled to said first low voltage, voltage level-shifting device and said first low voltage, voltage-offsetting device, and third and fourth complementary polarity high voltage, voltage-follower devices, coupled to said second low voltage, voltage level-shifting device and said second low voltage, voltage-offsetting device.

* * * * *